(12) United States Patent
Wang et al.

(10) Patent No.: US 8,372,719 B2
(45) Date of Patent: Feb. 12, 2013

(54) HARD MASK REMOVAL FOR SEMICONDUCTOR DEVICES

(75) Inventors: Sheng-Hsiung Wang, Zhubei (TW); Fu-Kai Yang, Dali (TW); Yuan-Ching Peng, Hsin-Chu (TW); Chi-Cheng Hung, Toufen Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 403 days.

(21) Appl. No.: 12/724,157

(22) Filed: Mar. 15, 2010

(65) Prior Publication Data

US 2011/0223753 A1    Sep. 15, 2011

(51) Int. Cl.
*H01L 21/461* (2006.01)
*H01L 21/027* (2006.01)

(52) U.S. Cl. . 438/279; 438/157; 438/275; 257/E21.023; 257/E21.029

(58) Field of Classification Search .......... None
See application file for complete search history.

(56) References Cited

U.S. PATENT DOCUMENTS 6,274,471 B1 * 8/2001 Huang ........................... 438/597
2007/0184668 A1 * 8/2007 Ning et al. .................... 438/752

* cited by examiner

*Primary Examiner* — Zandra Smith
*Assistant Examiner* — Pamela E Perkins
(74) *Attorney, Agent, or Firm* — Slater & Matsil, L.L.P.

(57) ABSTRACT

A method of removing a hard mask during fabrication of semiconductor devices is provided. A protective layer, such as a bottom anti-reflective coating (BARC) layer or other dielectric layer, is formed over structures formed on a substrate, wherein spacers are formed alongside the structures. In an embodiment, the structures are gate electrodes having a hard mask formed thereon and the spacers are spacers formed alongside the gate electrodes. A photoresist layer is formed over the protective layer, and the photoresist layer may be patterned to remove a portion of the photoresist layer over portions of the protective layer. Thereafter, an etch-back process is performed, such that the protective layer adjacent to the spacers remains to substantially protect the spacers. The hard mask is then removed while the protective layer protects the spacers.

20 Claims, 4 Drawing Sheets

HARD MASK REMOVAL FOR SEMICONDUCTOR DEVICES

TECHNICAL FIELD

This disclosure relates generally to semiconductor devices and, more particularly, to hard mask removal during the formation of semiconductor devices.

BACKGROUND

Some semiconductor devices, such as transistors, include one or more layers overlying a dielectric layer. For example, transistors are typically formed by depositing a dielectric layer and forming one or more gate layers over the dielectric layer. A hard mask layer is formed over the one or more gate layers. Thereafter, the hard mask layer and the one or more gate layers are patterned to form gate structures. Source/drain regions are formed by implanting ions on opposing sides of the gate structures. To create various doping profiles in the source/drain regions, spacers are frequently used. Spacers are formed alongside the gate structures by depositing a conformal dielectric layer and performing an anisotropic etch, thereby removing the dielectric layer from flat regions of a substrate while leaving a spacer alongside the gate structure. The spacers, among other things, protect the dielectric layer under the gate layers.

After forming the gate structure, the hard mask layer is usually removed. To remove the hard mask, a photoresist layer is formed over the gate structures and an etch-back process is performed to expose the hard mask layer, while remaining portions of the photoresist layer protect the spacers, isolation regions (e.g., shallow trench isolations, field oxide regions, or the like), and source/drain areas. Once exposed, the hard mask layer may be attacked.

During the etch-back process, however, the photoresist material alongside the gate structure may be recessed too far such that, when the hard mask layer is removed, a portion of the dielectric may be exposed and damaged, thereby adversely affecting the operation of the resulting device.

SUMMARY

These and other problems are generally reduced, solved or circumvented, and technical advantages are generally achieved, by embodiments discussed herein, which provide a method of removing a hard mask.

In an embodiment, a method of removing a masking layer, such as a mask over a gate electrode, is provided. In this example, the gate electrode overlies a gate dielectric layer, and the mask overlies the gate electrode. Spacers may be formed alongside the gate electrode. A protective layer, such as a bottom anti-reflective coating (BARC) layer or other dielectric layer, is formed over the gate electrode. A photoresist layer is formed over the protective layer, and the photoresist layer may be patterned to remove a portion of the photoresist layer over portions of the protective layer. Thereafter, an etch-back process is performed such that the protective layer adjacent to the spacers remains to substantially protect the gate dielectric layer and/or the spacers. The masking layer is then removed while the remaining portions of the protective layer protect the spacers and/or the gate dielectric layer.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

Figure 1:
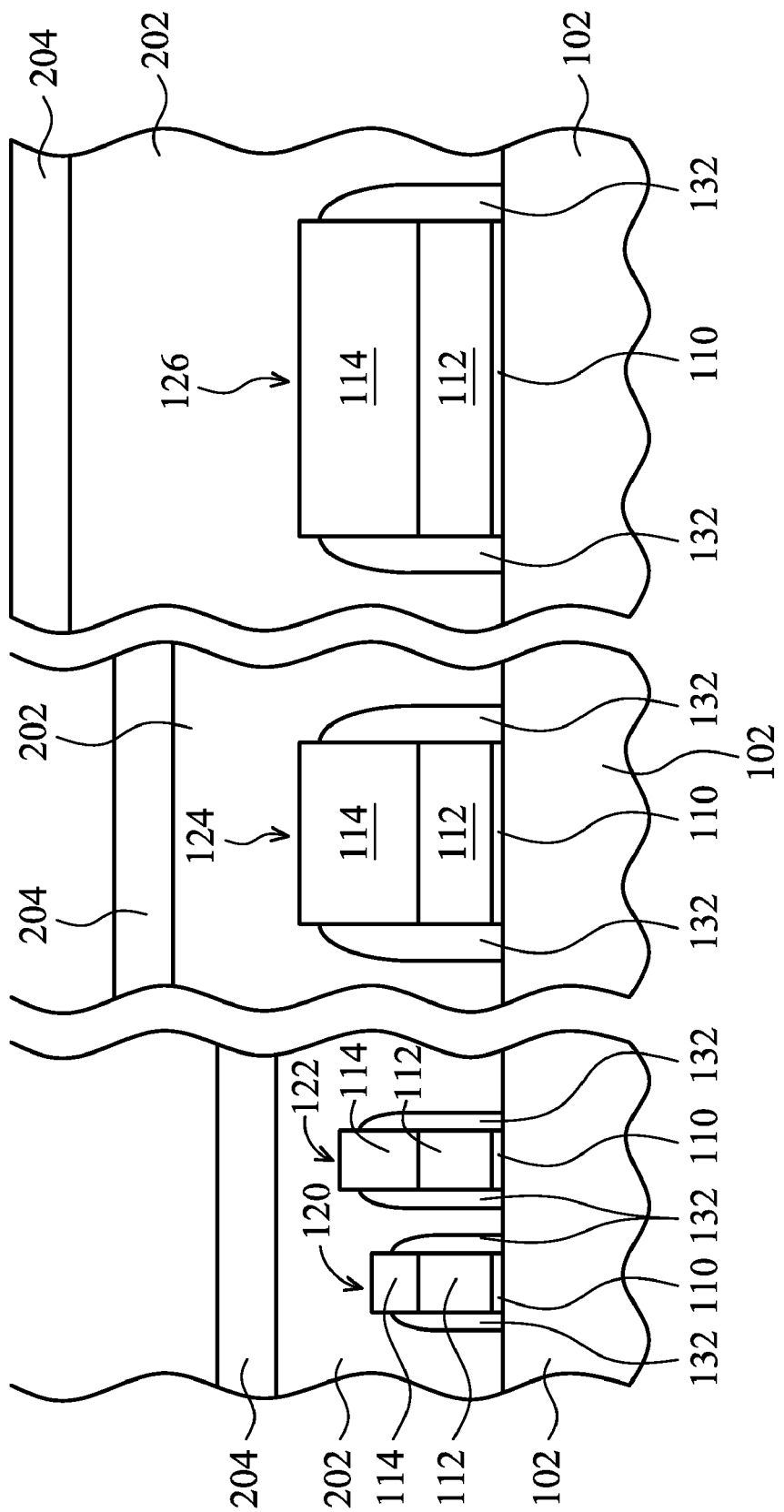
FIGS. 1-4 illustrate various process steps for removing a masking layer during fabrication of a semiconductor device in accordance with an embodiment.

The making and using of embodiments are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Embodiments described herein relate to the use of a masking layer in conjunction with a photoresist mask for the purpose of removing a hard mask. As will be discussed below, embodiments are disclosed with regard to removing a hard mask over a gate electrode of a field-effect transistor while protecting the sidewall spacers. Other embodiments, however, may be used in other situations. For example, other embodiments may be used with regard to finFETs, resistors, fuses, capacitors, or any other structure in which is it desired to protect a surface while removing one or more layers. Throughout the various views and illustrative embodiments, like reference numerals are used to designate like elements.

FIGS. 1-4 illustrate a method embodiment for fabricating a semiconductor device in accordance with an embodiment. Referring first to FIG. 1, a portion of a substrate 102 having transistors 120-126 formed thereon is shown in accordance with an embodiment. The substrate 102 may comprise bulk silicon, doped or undoped. In other embodiments, the substrate 102 may be an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

As illustrated in FIG. 1 and as one of ordinary skill in the art will realize, the transistors 120-126 may have different dimensions depending upon the desired purpose and operating characteristics of the semiconductor device. For example, the transistor 126 may have a relatively large gate length, such as a gate length of about 800 nm, while the other transistors 120, 122, and 124 may have smaller gate lengths relative to the gate length of transistor 126, such as a gate length of 240 nm or smaller. Other dimensions may be used.

In the embodiment illustrated in FIG. 1, each transistor 120-126 comprises, for example, a gate insulator layer 110, a gate electrode 112, and a hard mask 114. The gate insulator layer 110 may be a high-K dielectric material, such as silicon oxynitride, silicon nitride, an oxide, a nitrogen-containing oxide, a combination thereof, or the like. The gate insulator layer 110 may have, for example, a relative permittivity value greater than about 4. Other examples of such materials include aluminum oxide, lanthanum oxide, hafnium oxide, zirconium oxide, hafnium oxynitride, or combinations thereof. In some embodiments, the gate insulator layer 110 may be a composite layer, such as a layer of a high-K dielectric material and an oxide layer. The gate insulator layer 110 may be formed by any suitable process, such as a wet or dry thermal oxidation process. The gate insulator layer 110 may have a thickness of, for example, about 10 Å to about 100 Å in thickness.

The gate electrode 112 may comprise a conductive material, such as a metal (e.g., tantalum, titanium, molybdenum, tungsten, platinum, aluminum, hafnium, or ruthenium), a metal silicide (e.g., titanium silicide, cobalt silicide, nickel silicide, or tantalum silicide), a metal nitride (e.g., titanium nitride or tantalum nitride), doped poly-crystalline silicon, other conductive materials, or a combination thereof. In one example, amorphous silicon is deposited and recrystallized to create poly-crystalline silicon (poly-silicon). In an embodiment in which the gate electrode 112 is poly-silicon, the gate electrode 112 may be formed by depositing doped or undoped poly-silicon by a thermal deposition process to a thickness in the range of about 200 Å to about 1000 Å.

The hard mask 114 may comprise any suitable material to protect the underlying gate electrode 112 during subsequent processing. In an embodiment, the hard mask 114 comprises an oxide or a nitride, such as silicon oxide, silicon oxynitride, silicon nitride, or the like, deposited via LPCVD or via plasma enhanced CVD (PECVD) procedures to a thickness between about 200 Å and about 1400 Å. A multi-layer hard mask, such as layers of silicon dioxide and silicon nitride, may also be used. Furthermore, other materials, such as a metal, a metal nitride, a metal oxide, or the like, may be used. Other materials and thicknesses may be used.

The gate insulator layer 110, the gate electrode 112, and the hard mask 114 may be formed by depositing blanket layers and patterning the blanket layers using photolithography techniques as are known in the art. Generally, photolithography involves depositing a photoresist material, which is then masked, exposed, and developed. After the photoresist mask is patterned, an etching process may be performed to remove unwanted portions of the gate dielectric material and the gate electrode material to form the gate insulator layer 110 and the gate electrode 112 as illustrated in FIG. 1. In an embodiment in which the gate electrode material is poly-crystalline silicon and the gate dielectric material includes an oxide and a high-K dielectric material, the etching process may be a wet or dry, anisotropic or isotropic, etch process.

It should be noted that a thickness of the hard mask 114 may vary from transistor to transistor. For example, the hard mask 114 over the smaller transistors, e.g., transistors 120 and 122, may be thinner due to the loading effect as a result of the size and density of the transistor 120 during the etch process used to pattern the hard mask 114 and the gate electrode 112, resulting in the hard mask 114 over the smaller transistors being etched more than the other transistors.

In an embodiment, spacers 132 are formed alongside the gate electrodes 112. The spacers 132 may be formed by depositing and patterning a dielectric layer, such as forming a layer of silicon nitride ($Si_3N_4$) that has been formed using thermal deposition techniques. Other materials, such as an oxide, a nitrogen-containing layer (e.g., $Si_xN_y$, or silicon oxynitride $SiO_xN_y$), or a combination thereof, may also be used. In an embodiment, the dielectric layer is about 50 Å to about 250 Å in thickness. In an embodiment in which the dielectric layer is $Si_3N_4$, the spacers 132 may be patterned by performing an anisotropic dry etch process.

The particular structures, dimensions, and materials provided above are provided for illustrative purposes only. Different devices, materials, and dimensions may also be used. Additionally, additional structures may be present. For example, stress layers, source/drain regions, additional spacers/liners may be used, and the like.

It should also be noted that embodiments may be utilized in gate-first and/or gate-last fabrication processes. Gate-first processes refer to processes in which the gate electrode is formed before the source/drain regions are formed, and gate-last processes refer to processes in which a dummy gate electrode is utilized while forming the source/drain regions and the dummy gate electrode is replaced with the final gate electrode after the source/drain regions are formed.

A protective layer 202 and a photoresist layer 204 are formed over the substrate 102. The protective layer 202 may be, for example, a bottom anti-reflective coating (BARC). Generally, a BARC layer is used to prevent or reduce reflections during the patterning of the overlying photoresist layer 204. In the embodiment illustrated herein, the BARC layer acts to improve the photoresist (PR) loading effect and protect the spacers 132 during the removal of the hard mask 114. The BARC layer may be formed by spin-coating a suitable material, such as an organic polymer comprising carbon, oxygen, and/or nitrogen. It should be noted, however, that other dielectric materials may be used.

As one of ordinary skill in the art will appreciate, the thickness of the protective layer 202 may vary based upon, among other things, the size of the underlying structures (e.g., the size of the transistors 120-126), the pattern density, the relative etch rates between the protective layer 202 and the photoresist layer 204, and the like. As a result, the protective layer 202 overlying the transistors 120 and 122 may have a different thickness than the protective layer 202 overlying the larger transistors 124 and 126. Thereafter, the photoresist layer 204 is formed by, for example, spin-coating over the protective layer. In an embodiment in which the etching rates of the protective layer 202 to the photoresist layer 204 is about 1:1, the photoresist layer 204 is formed to a thickness of about 600 Å. It should be noted that the thickness of the protective layer 204 and the thickness of photoresist layer 204 are adjusted according the relative etching rates of the materials used to form the protective layers 202 and the photoresist layer 204 such that a sufficient thickness of the protective layer 202 remains after the etching is complete.

Figure 2:
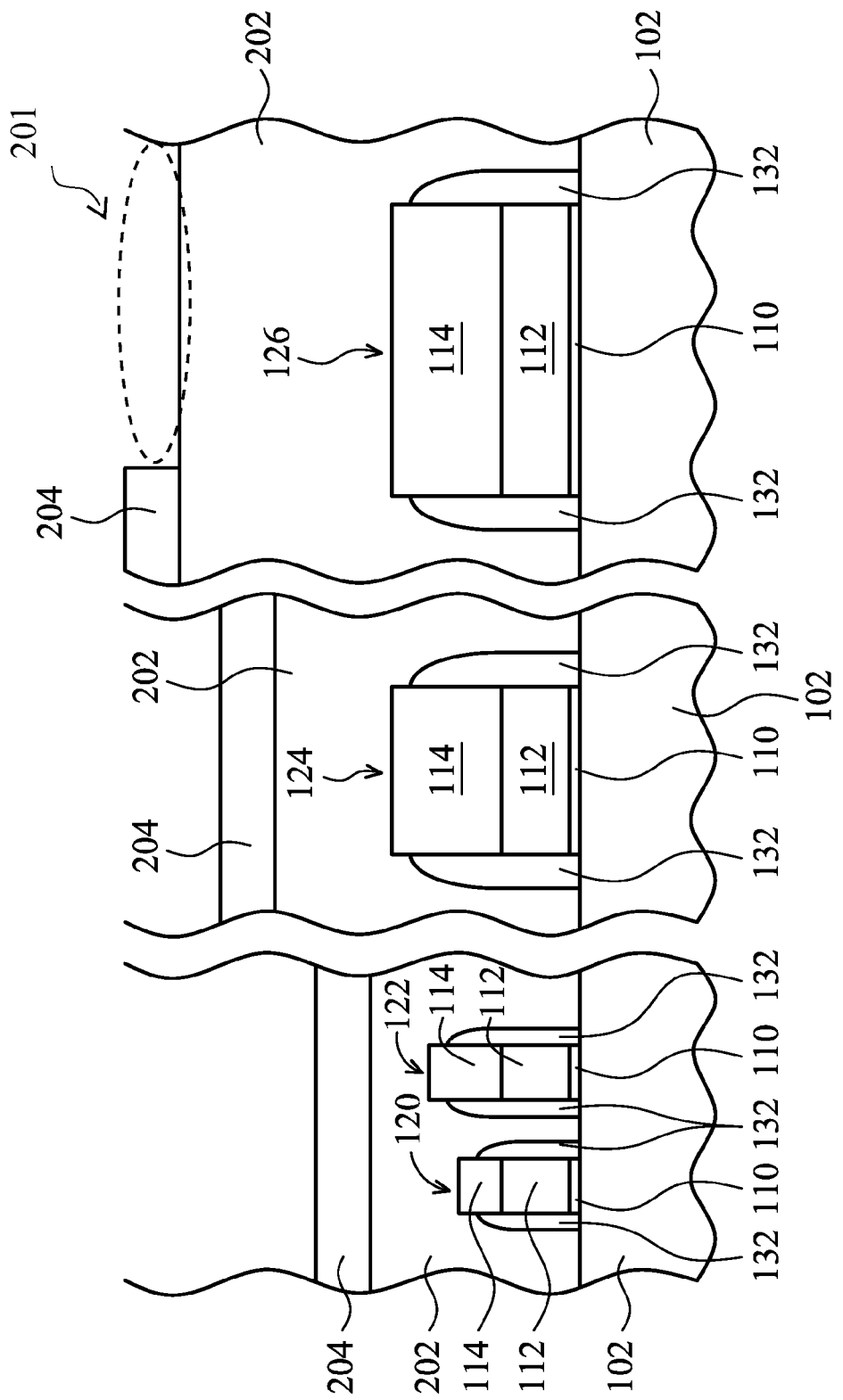

Referring now to FIG. 2, the photoresist layer 204 is patterned. As discussed above, it has been found that the thickness of the protective layer 202 overlying the larger expanses or denser patterns may tend to be thicker. As a result, the photoresist layer 204 may be patterned such that photoresist layer 204 is removed from over the thicker areas of the protective layer 202. For example, as illustrated in FIG. 2, the photoresist layer 204 in region 201 over the transistor 126 may be removed. It should be noted, however, that the photoresist layer 204 may be patterned such that the photoresist layer 204 remains directly over the edges of the hard mask 114 of transistor 126. In this manner, it is easier to prevent the recession of the protective layer 202 along the sidewalls of the transistor 126, thereby exposing the spacers 132 adjacent to the transistor 126.

Figure 3:
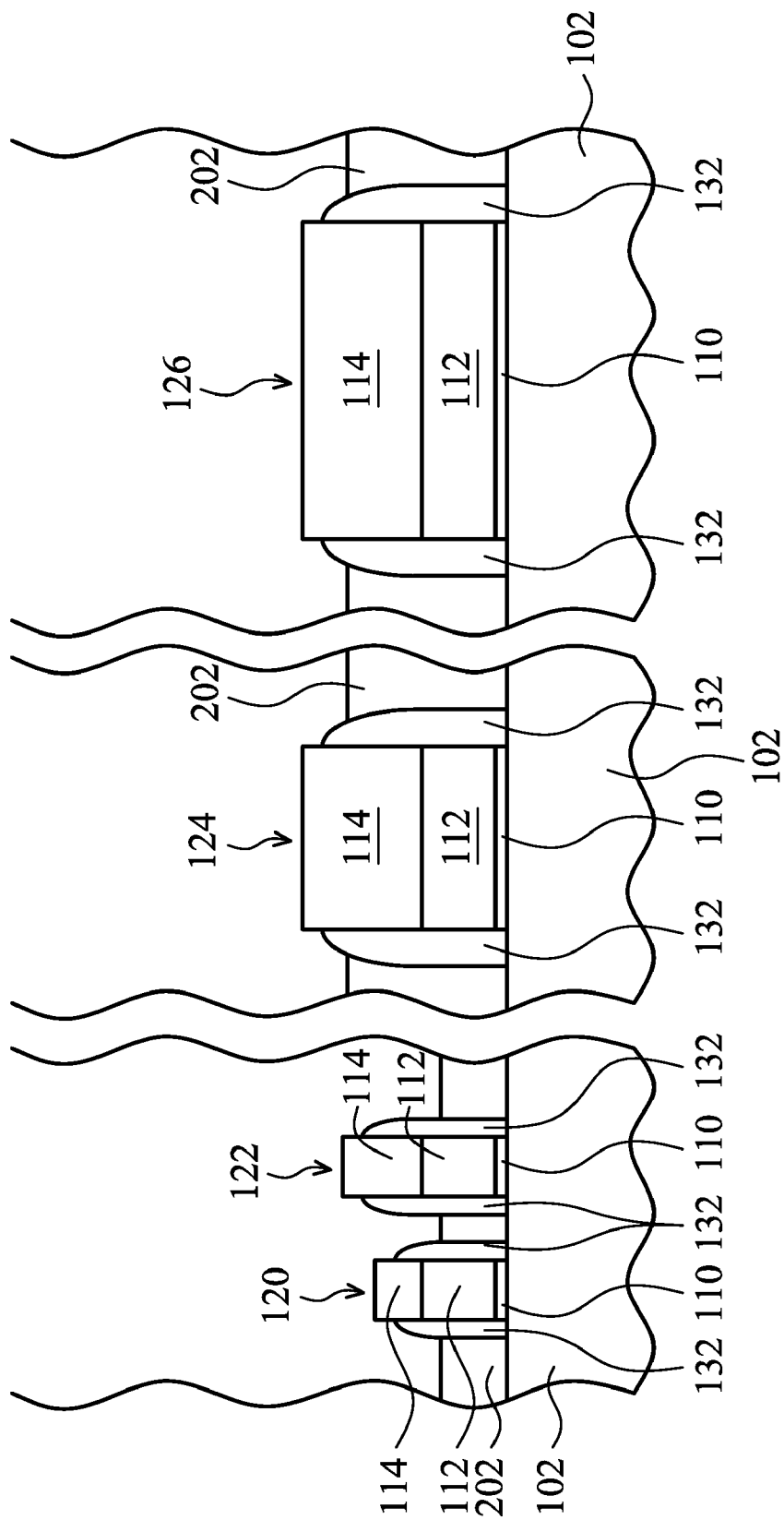

FIG. 3 illustrates an etch-back process of the patterned photoresist layer 204 and the protective layer 202. In an embodiment, the etch-back process is a timed, dry etch process, such as an $O_2$ plasma ashing process. In this embodiment, the photoresist material of the patterned photoresist layer 204 is etched isotropically such that the patterned photoresist layer 204 is etch laterally and horizontally, and the protective layer 202 is etched anisotropically such that the protective layer 202 is etched vertically for the most part. As a result of this process, the photoresist material is removed, and the protective layer 202 is etched-back, but yet protects substantial portions of the spacers 132.

Figure 4:
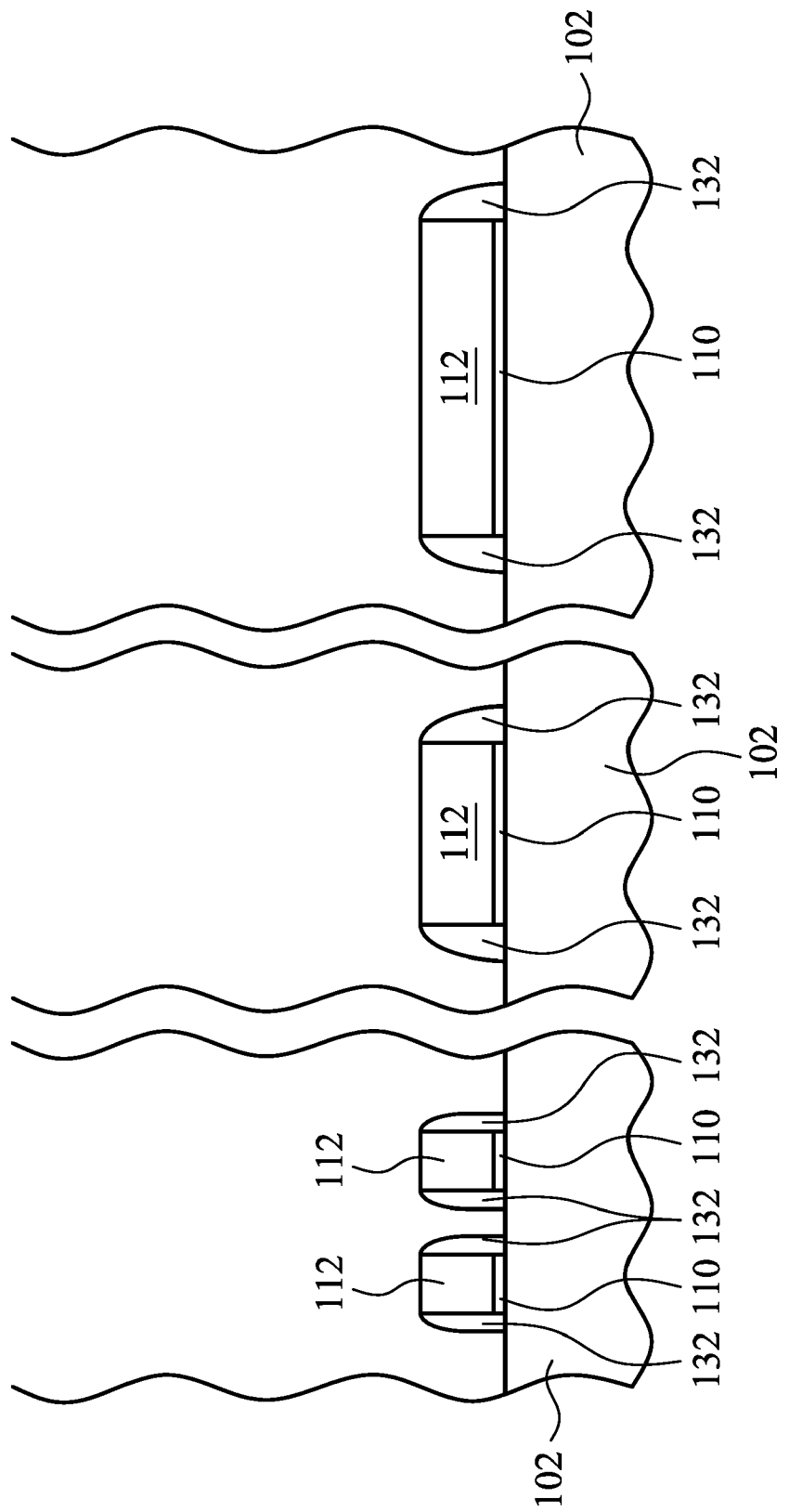

Thereafter, as illustrated in FIG. 4, the hard mask 114 is removed in accordance with an embodiment. The hard mask 114 may be removed using, for example, a dry etch process or other suitable processes. It should be noted that while the process of removing the hard mask 114 is performed, remaining portions of the protective layer 202 substantially cover the spacers 132, and hence, the gate insulator layer 110 is protected from being overly damaged by the hard mask removal process.

The remaining portions of the protective layer 202 may be removed thereafter using, for example, a dry etch process, such as an $O_2$ plasma ashing process. Thereafter, metallization layers and back-end-of-line (BEOL) processing techniques suitable for the particular application may be performed. For example, an encapsulant may be formed, a singulation process may be performed to singulate individual dies, wafer-level or die-level stacking, and the like, may be performed. It should be noted, however, that embodiments may be used in many different situations.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming a semiconductor device, the method comprising:
   forming a gate electrode on a substrate, the gate electrode having a gate dielectric interposed between the gate electrode and the substrate, a mask overlying the gate electrode;
   forming spacers alongside the gate electrode;
   forming a protective layer over the substrate, the spacers, and the mask;
   forming a patterned photoresist mask over the protective layer;
   etching the patterned photoresist mask and the protective layer after forming the patterned photoresist mask over the protective layer such that the patterned photoresist mask is removed and the protective layer is anisotropically etched, the protective layer substantially covering the spacers upon completing the etching; and
   removing the mask while the protective layer substantially covers the spacers.

2. The method of claim 1, wherein the protective layer is a bottom anti-reflective coating.

3. The method of claim 1, wherein the forming the protective layer is performed at least in part by spin-coating.

4. The method of claim 1, further comprising removing remaining portions of the protective layer after the removing the mask.

5. The method of claim 4, wherein the removing remaining portions is performed at least in part by a dry etch process.

6. The method of claim 5, wherein the dry etch process is an $O_2$ plasma ashing process.

7. A method of forming a semiconductor device, the method comprising:
   forming a plurality of structures on a substrate, the plurality of structures comprising a first layer and a mask layer over the first layer;
   forming spacers alongside the plurality of structures;
   forming a bottom anti-reflective coating (BARC) over the plurality of structures and the spacers;
   forming a photoresist layer over the BARC;
   patterning the photoresist layer to expose portions of the BARC over at least one of the plurality of structures;
   removing the entire photoresist layer and a portion of the BARC over the plurality of structures after patterning the photoresist layer, a portion of the BARC laterally adjacent to the spacers remaining after the removing;
   removing the mask layer after the removing the photoresist layer and the portion of the BARC over the plurality of structures; and
   removing remaining portions of the BARC.

8. The method of claim 7, wherein the plurality of structures are gate electrodes.

9. The method of claim 7, wherein the forming the BARC is performed at least in part by spin-coating.

10. The method of claim 7, wherein the removing remaining portions of the BARC is performed at least in part by a dry etch process.

11. The method of claim 10, wherein the dry etch process is an $O_2$ plasma ashing process.

12. The method of claim 7, wherein the removing the photoresist layer and the portion of the BARC is performed by a single, continuous etch process.

13. The method of claim 7, wherein the mask layer comprises silicon oxide.

14. The method of claim 7, wherein the spacers comprise silicon nitride.

15. A method of forming a semiconductor device, the method comprising:
   forming a gate dielectric on a substrate and a gate electrode over the gate dielectric;
   forming a mask layer over the gate electrode;
   forming a bottom anti-reflective coating (BARC) over the substrate and the mask layer;
   forming a photoresist layer over the BARC;
   removing the entire photoresist layer and a portion of the BARC after forming the photoresist layer over the BARC, thereby exposing the mask layer, the BARC remaining along sidewalls of the gate electrode after the removing;
   removing the mask layer after the removing the entire photoresist layer and the portion of the BARC; and
   removing remaining portions of the BARC.

16. The method of claim 15, wherein the removing the remaining portion of the BARC is performed at least in part by an $O_2$ plasma ashing process.

17. The method of claim 15, further comprising patterning the photoresist layer to expose portions of the BARC over the gate electrode prior to the removing the photoresist layer.

18. The method of claim 15, further comprising gate spacers alongside the gate dielectric.

19. The method of claim 18, wherein the removing the photoresist layer and the portion of the BARC results in portions of the BARC remaining alongside the gate spacers.

20. The method of claim 15, wherein the forming the BARC is performed at least in part by spin-coating.

* * * * *